(12) United States Patent
Zhang et al.

(10) Patent No.: US 10,548,194 B1
(45) Date of Patent: Jan. 28, 2020

(54) LOCAL DIMMING CONTROL METHOD AND DEVICE

(71) Applicant: Novatek Microelectronics Corp., Hsinchu (TW)

(72) Inventors: Xiao Zhang, ShaanXi Province (CN); JianHua Liang, ShaanXi Province (CN)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/429,046

(22) Filed: Jun. 2, 2019

(30) Foreign Application Priority Data

May 16, 2019 (CN) .......................... 2019 1 0405745

(51) Int. Cl.
*H05B 33/08* (2006.01)
*H03K 7/08* (2006.01)
*G02F 1/1335* (2006.01)
*G09G 3/34* (2006.01)

(52) U.S. Cl.
CPC ... *H05B 33/0845* (2013.01); *G02F 1/133603* (2013.01); *G09G 3/3406* (2013.01); *H03K 7/08* (2013.01); *G02F 2001/133612* (2013.01)

(58) Field of Classification Search
CPC .... H05B 33/0845; G09G 3/3406; H03K 7/08; G02F 1/133603; G02F 2001/133612

USPC ......................................................... 315/307
See application file for complete search history.

(56) References Cited

U.S. PATENT DOCUMENTS

| | | | |
|---|---|---|---|
| 2011/0115815 A1* | 5/2011 | Xu ........................ | G06T 5/003 345/626 |
| 2014/0092000 A1* | 4/2014 | Nonaka .................... | G09G 3/34 345/102 |
| 2016/0117807 A1* | 4/2016 | Matsumoto ............. | G06T 5/008 382/261 |
| 2016/0248991 A1* | 8/2016 | Matsumoto ............ | H04N 5/142 |

\* cited by examiner

*Primary Examiner* — Don P Le
(74) *Attorney, Agent, or Firm* — JCIPRNET

(57) ABSTRACT

A local dimming control method for a backlight module having a plurality of light emitting diodes is provided. The local dimming control method includes the steps of determining an initial duty cycle of a driving signal, calculating brightness of each light emitting diode according to the initial duty cycle, calculating a local luminance of each light emitting diode based on combination of brightness of that light emitting diode and light diffusion of surrounding light emitting diodes, calculating a cost function of clipping error and leaking error according to the local luminance of each light emitting diode and an ideal brightness of the corresponding pixel, calculating a gradient of the cost function of clipping error and leaking error, and adjusting the initial duty cycle according to the gradient, and image characteristics of the pixel and the surrounding pixels to provide an adjusted duty cycle of the driving signal.

16 Claims, 8 Drawing Sheets

LOCAL DIMMING CONTROL METHOD AND DEVICE

CROSS-REFERENCE TO RELATED APPLICATION

This application claims the priority benefit of China application serial no. 201910405745.9, filed on May 16, 2019. The entirety of the above-mentioned patent application is hereby incorporated by reference herein and made a part of this specification.

BACKGROUND

Technical Field

The disclosure relates to a local dimming control method and device, and more particularly to a local dimming control method and device capable of adjusting the duty cycle of the driving signal of the display panel quickly and properly.

Description of Related Art

Due to rapid advancement of technologies, portable electronics and flat panel displays have gained popularity. Among various types of flat panel displays, liquid crystal displays (LCDs) have gradually become the mainstream display products due to advantages such as low operating voltage, lack of harmful radiation, light weight and small and compact size. The LCD is formed mainly by the backlight module and the display panel, and since the display panel cannot emit light by itself, the backlight module is used to provide the backlight source needed by LCD for image display. Based on light incident method, the backlight module may be categorized into two types, the direct-type backlight module and the edge-type backlight module.

Moreover, while the display quality of the LCD increases with user demand, the backlight module is no longer solely used as the light source. In order to enhance the efficiency of the display device, the brightness of the backlight module is adjusted in accordance with different display conditions and power consumption. Further, the duty cycles of the driving signals controlling the light emitting diodes of the backlight module are adjusted in order to adjust the brightness of the backlight module.

Generally, the duty cycle of the driving signal of one light emitting diode in the backlight module is adjusted based on the blending of the max brightness and average brightness of that light emitting diode or the corresponding pixel. Therefore, when the dark area of displayed image has little brighter details, the halo phenomenon is stronger. In the bright area of the displayed image, in order to represent white, the duty cycle is equal to the maximum (which is 100%). Further, the clipping is greater and the peak intensity cannot be reached.

SUMMARY

The disclosure is directed to a local dimming control method and device, and more particularly to a local dimming control method and device capable of adjusting the duty cycle of the driving signal of the display panel quickly and properly with consideration of light diffusion, thereby enhancing the display quality of the display panel.

A local dimming control method is applied to a backlight module having a plurality of light emitting diodes, each light emitting diode is configured to provide light to one pixel in a display panel. The local dimming control method includes the steps of determining an initial duty cycle of a driving signal provided to drive each light emitting diode, calculating brightness of each light emitting diode according to the initial duty cycle of the driving signal, calculating a local luminance of each light emitting diode based on combination of brightness of that light emitting diode and light diffusion of surrounding light emitting diodes, calculating a cost function of clipping error and leaking error according to the local luminance of each light emitting diode and an ideal brightness of the corresponding pixel, calculating a gradient of the cost function of clipping error and leaking error, and adjusting the initial duty cycle of each light emitting diode according to the gradient, an image characteristic of the pixel corresponding to that light emitting diode, and image characteristics of surrounding pixels to provide an adjusted duty cycle of the driving signal.

In one embodiment of the disclosure, step of adjusting the initial duty cycle according to gradient of the cost function of clipping error and leaking error to provide the adjusted duty cycle of the driving signal includes increasing the initial duty cycle when the gradient of the cost function of clipping error and leaking error is negative.

In one embodiment of the disclosure, step of adjusting the initial duty cycle according to gradient of the cost function of clipping error and leaking error to provide the adjusted duty cycle of the driving signal includes decreasing the initial duty cycle when the gradient of the cost function of clipping error and leaking error is positive.

In one embodiment of the disclosure, the gradient of the cost function of clipping error and leaking error is a derivative of the cost function of clipping error and leaking error with respect to brightness of the light emitting diodes.

In one embodiment of the disclosure, the clipping error is a difference between the brightness of each light emitting diode and the ideal brightness of the corresponding pixel.

In one embodiment of the disclosure, the leaking error is calculated based on the brightness of each light emitting diode and the ideal brightness of the corresponding pixel.

In one embodiment of the disclosure, the driving signal is a pulse width modulation signal.

In one embodiment of the disclosure, the initial duty cycle of the driving signal is determined according to red, green, and blue data input.

A local dimming control device for a backlight module having a plurality of light emitting diodes is provided, and each light emitting diode is configured to provide light to one pixel in a display panel. The local dimming control device includes a memory storing a plurality of program codes, and a processor in communication with the memory. The program codes includes an initial duty cycle calculating module, a pixel intensity calculating module, a gradient calculating module, and a duty adjusting module. The processor executes the initial duty cycle calculating module to determine an initial duty cycle of a driving signal provided to drive each light emitting diode. The processor executes the pixel intensity calculating module to calculate brightness of each light emitting diode according to the initial duty cycle of the driving signal and calculate a local luminance of each light emitting diode based on combination of brightness of that light emitting diode and light diffusion of surrounding light emitting diodes. In addition, the processor executes the gradient calculating module to calculate a cost function of clipping error and leaking error according to the local luminance of each light emitting diode and an ideal brightness of the corresponding pixel and calculate a gradient of the cost function of clipping error and leaking error. Further, the processor executes the duty adjusting module to adjust the initial duty cycle of each light emitting diode according to the gradient, an image characteristic of the pixel corresponding to that light emitting diode, and image characteristics of surrounding pixels to provide an adjusted duty cycle of the driving signal.

In one embodiment of the disclosure, the processor further executes the duty adjusting module to increase the initial duty cycle when the gradient of the cost function of clipping error and leaking error is negative.

In one embodiment of the disclosure, the processor further executes the duty adjusting module to decrease the initial duty cycle when the gradient of the cost function of clipping error and leaking error is positive.

Based on the above, in the local dimming control method and device of the disclosure, the light diffusion is considered in calculating the local luminance. In addition, when the gradient of the cost function of clipping error and leaking error is calculated, the direction that the cost function of clipping error and leaking error increases the most rapidly is also defined. Therefore, modifying the duty cycle of the driving signal of the light emitting diode in the opposite direction makes the cost function of clipping error and leaking error decrease the most rapidly, which means the smaller clipping error and leaking error. That is to say, the duty cycle is adjusted faster (may be with just one time adjustment) and properly with considering of light diffusion of the surrounding light emitting diodes.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
FIG. 1 is a schematic view of a display panel according to one embodiment of the disclosure.

FIG. 1 is a schematic view of a display panel according to one embodiment of the disclosure. As shown in FIG. 1, a display panel 10 includes a liquid crystal panel 110 and a backlight module 120. The backlight module 120 is disposed under the liquid crystal panel 110 and serves as a light source for the liquid crystal panel 110. In the present embodiment, the display panel 10 is a liquid crystal display (LCD) panel.

Figure 2A:
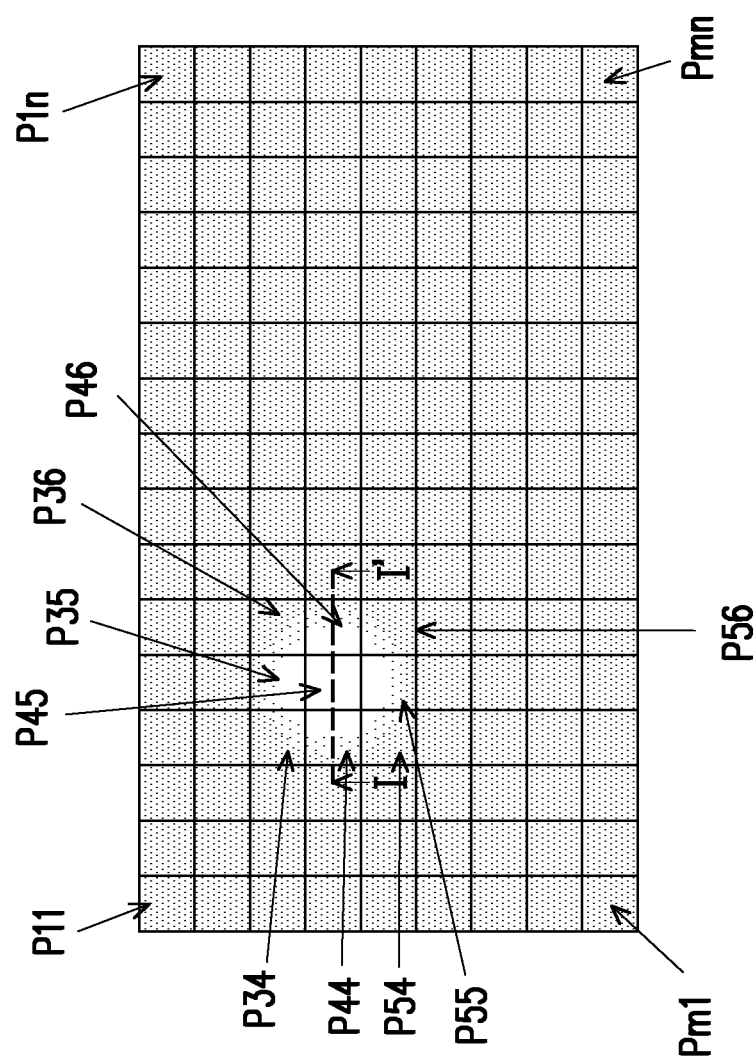
FIG. 2A is a schematic view of a liquid crystal panel of the display panel in FIG. 1.
Figure 2B:
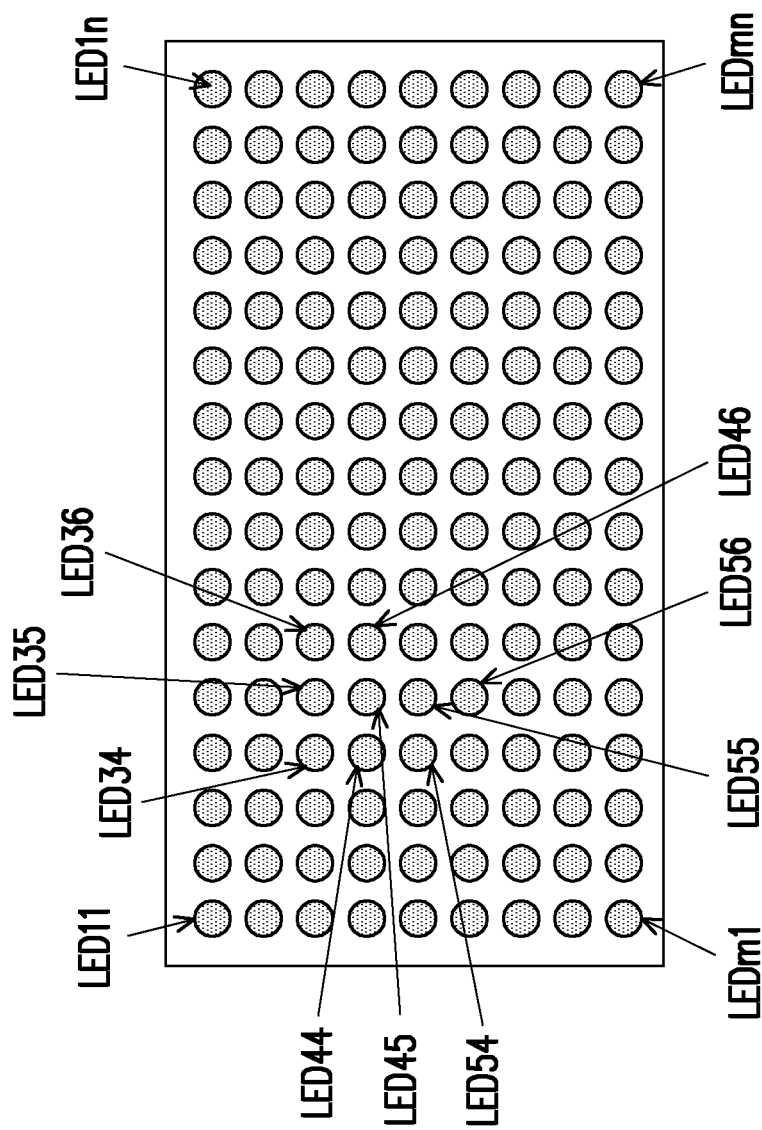
FIG. 2B is a schematic view of a backlight module of the display panel in FIG. 1.

FIG. 2A is a schematic view of a liquid crystal panel of the display panel in FIG. 1. FIG. 2B is a schematic view of a backlight module of the display panel in FIG. 1. As shown in FIG. 2A, the liquid crystal panel 110 includes a plurality of pixels $P_{11}$ to $P_{mn}$, and m and n are integers greater than zero. Further, as shown in FIG. 2B, the backlight module 120 includes a plurality of light emitting diodes $LED_{11}$ to $LED_{mn}$ corresponding to the pixels $P_{11}$ to $P_{mn}$, respectively. That is to say, the light emitting diode $LED_{11}$ is configured to provide light or illuminate the pixel $P_{11}$, the light emitting diode $LED_{12}$ is configured to provide light or illuminate the pixel $P_{12}$, and so on, until the light emitting diode $LED_{mn}$ is configured to provide light for or illuminate the pixel $P_{mn}$. To be more specific, each of the light emitting diodes $LED_{11}$ to $LED_{mn}$ is controlled by a pulse width modulation (PWM) signal having a duty cycle. When the duty cycle of the PWM signal increases or become longer, the brightness of the corresponding light emitting diode also increases. When the duty cycle of the PWM signal decreases or become shorter, the brightness of the corresponding light emitting diode also decreases. The brightness of the light emitting diode or the pixel is represented by a pixel value, such as number is stored as an 8-bit integer giving a range of possible values from 0 to 255, but the disclosure is not limited thereto. In FIGS. 2A and 2B, the pixels P34, P35, P36, P44, P45, P46, P54, P55, and P56 of the liquid crystal panel 110 and the corresponding light emitting diodes LED34, LED35, LED36, LED44, LED45, LED46, LED54, LED55, and LED56 of the backlight module 120 are indicated for purpose of description only, the disclosure is not limited thereto. In the disclosure, one pixel is one segment.

Figure 3A:
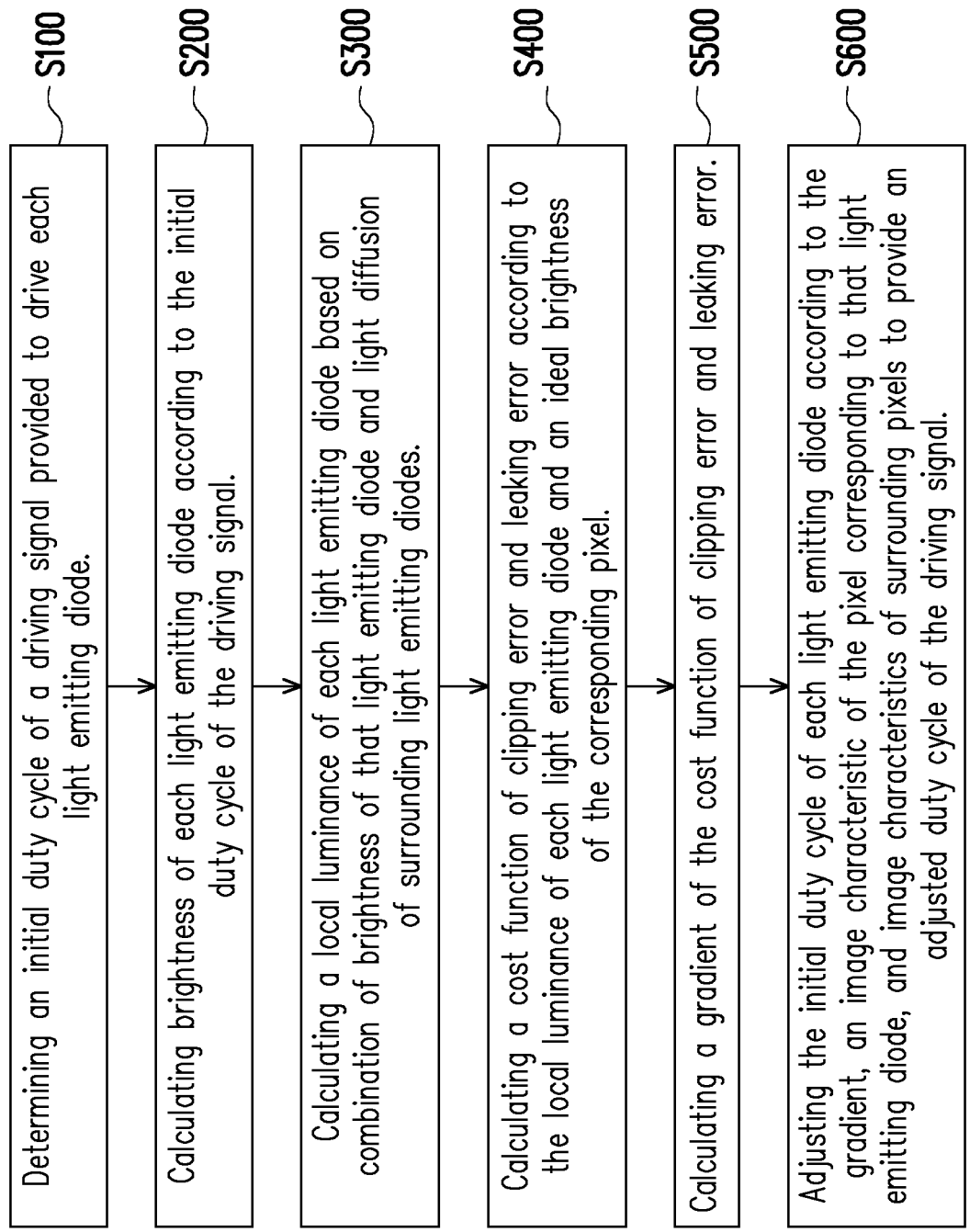
FIG. 3A, FIG. 3B, and FIG. 3C are flowcharts illustrating a local dimming control method according to one embodiment of the disclosure.
Figure 3B:
Figure 3C:

FIG. 3A, FIG. 3B, and FIG. 3C are flowcharts illustrating a local dimming control method according to one embodiment of the disclosure. As shown in FIG. 3A, in the step S100, an initial duty cycle of the driving signal, which is a PWM signal, provided to drive each light emitting diode is determined. To be more specific, the red, green, and blue data inputs are transmitted to the display panel 10 to provide data about the target brightness or luminance of each of the pixels $P_{11}$ to $P_{mn}$ in order to display an image. Since the pixels $P_{11}$ to $P_{mn}$ are illuminated by the light emitting diodes $LED_{11}$ to $LED_{mn}$, respectively, the duty cycle of the PWM signal controlling the each of the light emitting diodes $LED_{11}$ to $LED_{mn}$ must be appropriately calculated. In order to do so, firstly, the initial duty cycles of the PWM signals controlling the corresponding light emitting diodes $LED_{11}$ to $LED_{mn}$ are calculated. In the present embodiment, each of the initial duty cycles is calculated by the following formula.

$$r_{int}=\text{Max}*a+\text{APL}*(1-a)$$

Wherein, $r_{int}$ is the initial duty cycle of one light emitting diode, Max is the maximum pixel level of the entire image, APL is the average pixel level of entire image, and a is a coefficient. In the present embodiment, a is equal to 0.8, but the disclosure is not limited thereto. It should be noted here, the initial duty cycle is calculated according to various existing methods and based on previous statistical information.

Next, in step S200, the brightness r of each of the light emitting diodes $LED_{11}$ to $LED_{mn}$ is calculated according to the corresponding initial duty cycle $r_{int}$ of the driving signal. Further, in step S300, a local luminance B of each of the light emitting diodes $LED_{11}$ to $LED_{mn}$ is calculated based on combination of brightness of that light emitting diode and light diffusion of surrounding light emitting diodes. In other words, the local luminance of the backlight results from the combination of the Point Spread Functions (PSFs) of all light emitting diodes, each multiplied by the duty-cycle of the light emitting diodes. That is to say, the local luminance of the backlight is the convolution of the duty-cycle of the light emitting diodes and Point Spread Functions of the light emitting diodes. For example, the local luminance B (or the pixel intensity) at a certain pixel of the display panel 10 is determined by the following formula:

$$B = \sum_{k=1}^{M} h_k * r_k$$

Figure 4:
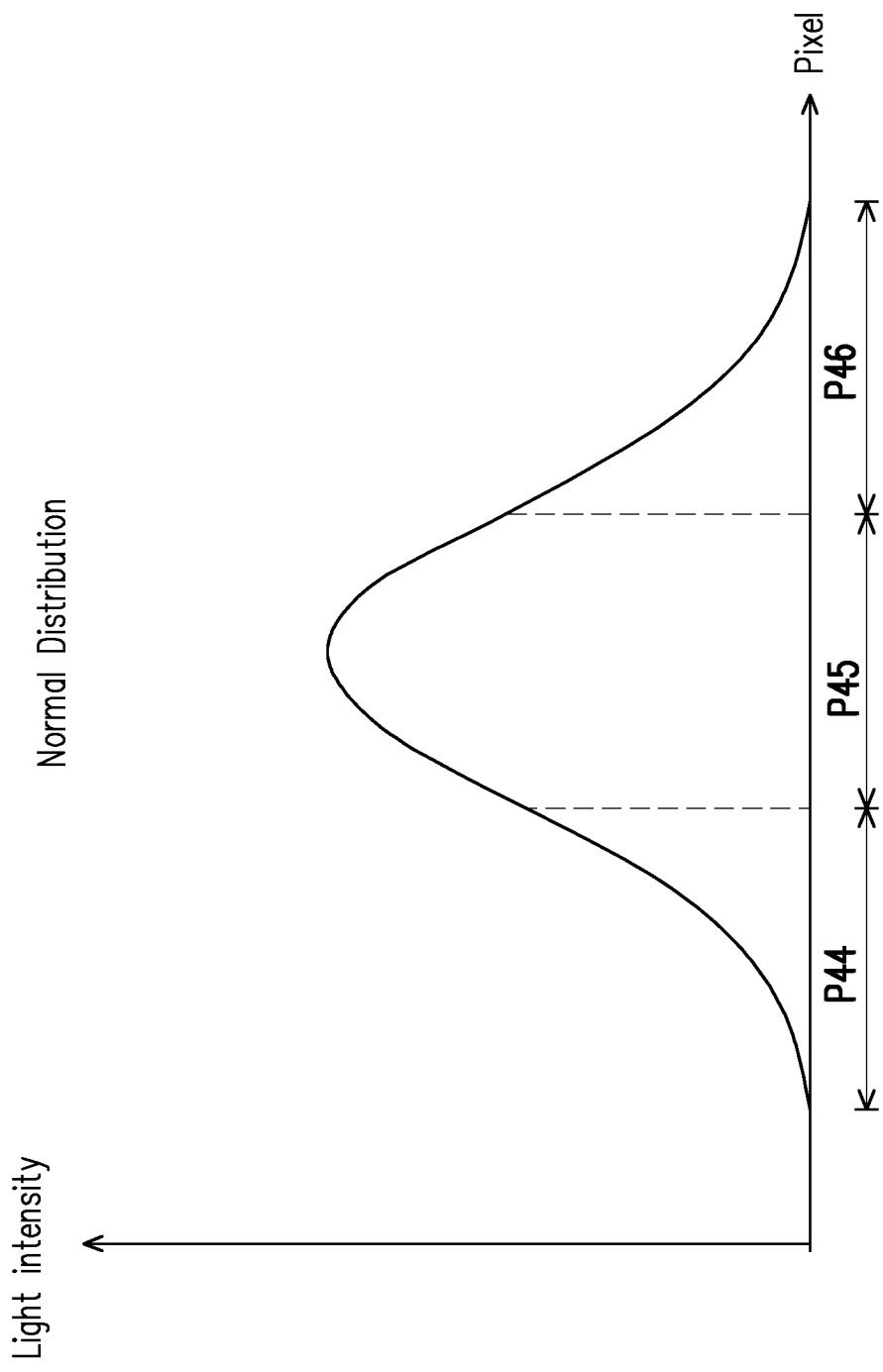
FIG. 4 is a schematic view showing a light distribution along a line I-I' in FIG. 2A.

Wherein, M is number of the light emitting diodes including the certain pixel and the surrounding pixels, $r_k$ is the brightness or duty cycle of one light emitting diode k in M light emitting diodes, and $h_k$ is diffusion coefficient which represents the light influence at this certain pixel position of the surrounding pixels and is in range of 0 to 1. For demonstration purpose, referring to FIGS. 2A, 2B, and 4. FIG. 4 is a schematic view showing a light distribution along a line I-I' in FIG. 2A. As shown in FIG. 2A and FIG. 2B, the light emitting diode LED45 emits light to illuminate the pixel P45, the distribution of the emitted light is a Gauss distribution as an example and is shown in FIG. 4, but the disclosure is not limited thereto. It should be noted here, the distribution of the emitted light may be another type of distribution other than Gauss distribution. As shown in FIG. 4, the light illuminating the pixel P45 distributes over the pixels P44 and P46 as well, so as to affect the pixels P44 and P46. That is to say, the light illuminating one pixel distributes over the surrounding pixels. Therefore, when calculating the brightness of one pixel, the surrounding pixels should be considered as well. For example, when calculating the local luminance B at the pixel P45, the brightness of the pixels P33, P34, P35, P44, P46, P54, P55, and P56 surrounding the pixel P45 should also be considered. Therefore, there are brightness and diffusion coefficient of M=9 pixels included in the formula in order to calculate the local luminance B at the pixel P45. That is to say, when the local luminance of one light emitting diode is calculated, the brightness of the surrounding light emitting diodes are also considered. In other words, the light diffusion is considered in calculating the local luminance.

Next, in step S400, a cost function of clipping error and leaking error is calculated according to the local luminance of each light emitting diode and an ideal brightness of the corresponding pixel. The local luminance is mentioned above, and the clipping error, the leaking error, and the ideal brightness are described hereinafter.

Specifically, in LCD display, in order to represent black color, the liquid crystal completely closes to block the light emitted from the corresponding light emitting diode. However, in practice, when the liquid crystal completely closes, there is still light leaking at the periphery of the liquid crystal. That is to say, the liquid crystal cannot block all the emitting light due to leakage. Leakage can be modeled linearly by using a parameter 1, also called leakage factor, defined as the amount of light leaking through a pixel $P_{ij}$ when the liquid crystal completely closes and the local luminance B at the pixel $P_{ij}$ is equal to 1 (the duty cycle is 100%). In addition, the ideal brightness of a pixel represents the target brightness of that pixel in order to display the image. In other words, the ideal brightness is achieved when the light emitting diode is enabled without leakage and without clipping. This ideal brightness may be obtained from the red, green, blue data inputs, the disclosure is not limited thereto. Further, the leaking error is calculated based on the brightness of each light emitting diode, the ideal brightness of the corresponding pixel, and the leakage factor 1. For example, the leaking error is calculated by the following formula.

$$El = \sum_{(i,j) \in Dl} (l * B(i, j) - y(i, j))$$

Wherein, El is leaking error, Dl is a set of pixels having leaking problem in the display, i and j are integers greater than zero and represent the row and column of the pixels of the set Dl, l is leakage factor which is measured by experiment and in range of 0.001 to 0.01, such as 0.005, B(i,j) is the local luminance of the pixel $P_{ij}$ of the set Dl, y(i,j) is ideal brightness at the pixel $P_{ij}$ of the set Dl. In other words, the leaking error is a summation of the difference between the ideal brightness and the multiplication of the leakage factor and the local luminance of each pixel in the set of pixels distorted by leaking in the display.

In addition, the clipping error is a difference between the brightness of each light emitting diode and the ideal brightness of the corresponding pixel. In other words, the clipping is the phenomenon that the brightness of the pixel cannot reach the required brightness. In the present embodiment, the clipping error is calculated by the following formula as an example.

$$Ec = \sum_{(i,j) \in Dc} (y(i, j) - B(i, j))$$

Wherein, Ec is clipping error, Dc is a set of pixels having clipping problem in the display, i and j are integers greater than zero and represent the row and column of the pixels of the set Dc, y(i,j) is ideal brightness at the pixel $P_{ij}$ of the set Dc, and B(i,j) is the local luminance of the pixel $P_{ij}$ of the set Dc. In other words, the clipping error is a summation of the difference between the ideal brightness and the local luminance of each pixel in the set of pixels distorted by clipping in the display.

Further, the cost function of clipping error and leaking error is calculated by the following formula.

$$f = Ec + El$$

Wherein, f is the cost function of clipping error and leaking error, El and Ec are the leaking error and the clipping error, respectively, as mentioned above.

Next, in step S500, a gradient of the cost function of clipping error and leaking error is calculated. To be more specific, the gradient of the cost function of clipping error and leaking error is a derivative of the cost function of clipping error and leaking error with respect to brightness of the light emitting diodes (or duty cycles controlling the light emitting diodes). In the present embodiment, the gradient of the cost function of clipping error and leaking error is calculated as follows.

$$\text{Gradient} = \frac{\partial f}{\partial r_k}$$

The gradient of the cost function of clipping error and leaking error indicates the direction that the cost function of clipping error and leaking error increases the most rapidly, which means the greater clipping error and leaking error, in terms of variation of each light emitting diode value (such as brightness of the light emitting diode, the duty cycle of the driving signal of the light emitting diode). Therefore, modifying the duty cycle of the driving signal of the light emitting diode in the opposite direction makes the cost function of clipping error and leaking error decrease the most rapidly, which means the smaller clipping error and leaking error. In other words, the duty cycle is adjusted in a direction opposite the direction of the gradient.

Based on the above, in Step S600, the initial duty cycle of each light emitting diode is adjusted according to the gradient, an image characteristic of the pixel corresponding to that light emitting diode, and image characteristics of surrounding pixels to provide an adjusted duty cycle of the driving signal. To be more specific, the initial duty cycle is adjusted in step S600a or in step S600b, shown in FIGS. 3B and 3C. In step S600a of FIG. 3B, the initial duty cycle is increased when the gradient of the cost function of clipping error and leaking error is negative. For example, the adjusted duty cycle of the pixel is summation of the initial duty cycle and a function of the average duty cycle and the maximum duty cycle of that pixel and the surrounding pixels. That is to say, if the gradient is smaller than zero, the adjusted duty cycle of the pixel will be calculated as follows.

$$r = r_{int} + f(\text{pixel APL, surrounding pixels APL})$$

Wherein, r is the adjusted duty cycle of one light emitting diode, $r_{int}$ is the initial duty cycle of one light emitting diode, and f (pixel APL, surrounding pixels APL) is a function of the average pixel level of the certain pixel and the average pixel level of the surrounding pixels. It should be noted here, when the gradient of the cost function of clipping error and leaking error is negative, the pixel is affected by clipping.

In step S600b of FIG. 3C, the initial duty cycle is decreased when the gradient of the cost function of clipping error and leaking error is positive. For example, the adjusted duty cycle of the pixel is a function of the initial duty cycle and the average duty cycle of that pixel and the surrounding pixels. That is to say, if the gradient is greater than zero, the adjusted duty cycle of the pixel will be calculated as follows.

$$r = r_{int} * g(\text{pixel APL, surrounding pixels APL})$$

Wherein, r is the adjusted duty cycle of one light emitting diode, $r_{int}$ is the initial duty cycle of one light emitting diode, and g(pixel APL, surrounding pixels APL) is a function of the average pixel level of the certain pixel and the average pixel level of the surrounding pixels and is in rage of 0 to 1. It should be noted here, when the gradient of the cost function of clipping error and leaking error is positive, the pixel is affected by halo phenomenon.

Based on the above, when the gradient of the cost function of clipping error and leaking error is calculated, the direction that the cost function of clipping error and leaking error increases the most rapidly is also defined. Therefore, modifying the duty cycle of the driving signal of the light emitting diode in the opposite direction makes the cost function of clipping error and leaking error decrease the most rapidly, which means the smaller clipping error and leaking error. In addition, the adjusted duty cycle of one light emitting diode is calculated with considering the image characteristic of the pixel corresponding to that light emitting diode and the image characteristics of the surrounding pixels. That is to say, the duty cycle is adjusted quickly and properly with considering of light diffusion of the surrounding light emitting diodes, thereby enhancing the display quality of the display panel. In comparison with conventional method, iteration in calculating the gradient is not required in the disclosure, and the image characteristics of the surrounding pixels are also considered in the disclosure so the light diffusion is taken into consideration.

In the present embodiment, the steps in the local dimming control method are performed by a processor in communication with a memory. For example, the processor may be Central Processing Unit (CPU), Microprocessor, Digital Signal Processor (DSP), Programmable Controller, Programmable Logic Device (PLD), or other similar devices, a combination of the said devices, which are not particularly limited by the disclosure. Further, each of the steps in FIGS. 3A, 3B, and 3C may also be implemented as a plurality of program codes. These program codes will be stored in the memory, so that these program codes may be executed by the processor. Alternatively, in other embodiments, each of steps in FIGS. 3A, 3B, and 3C may be performed one or more circuits. The disclosure is not intended to limit whether each of the steps in FIGS. 3A, 3B, and 3C are carried out by ways of software or hardware. In the present embodiment, the steps in the local dimming control method is performed once in order to provide the adjusted duty cycle.

Figure 5:
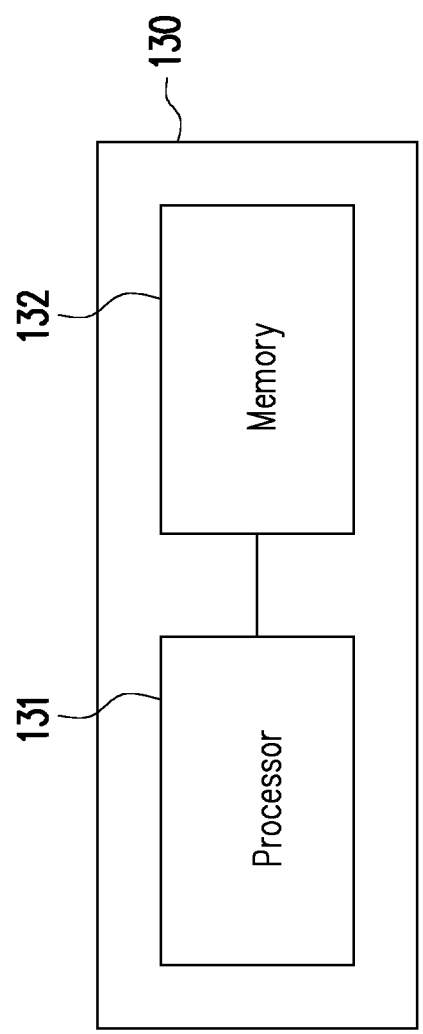
FIG. 5 is a block diagram illustrating a local dimming control device according to an embodiment of the disclosure.
Figure 6:
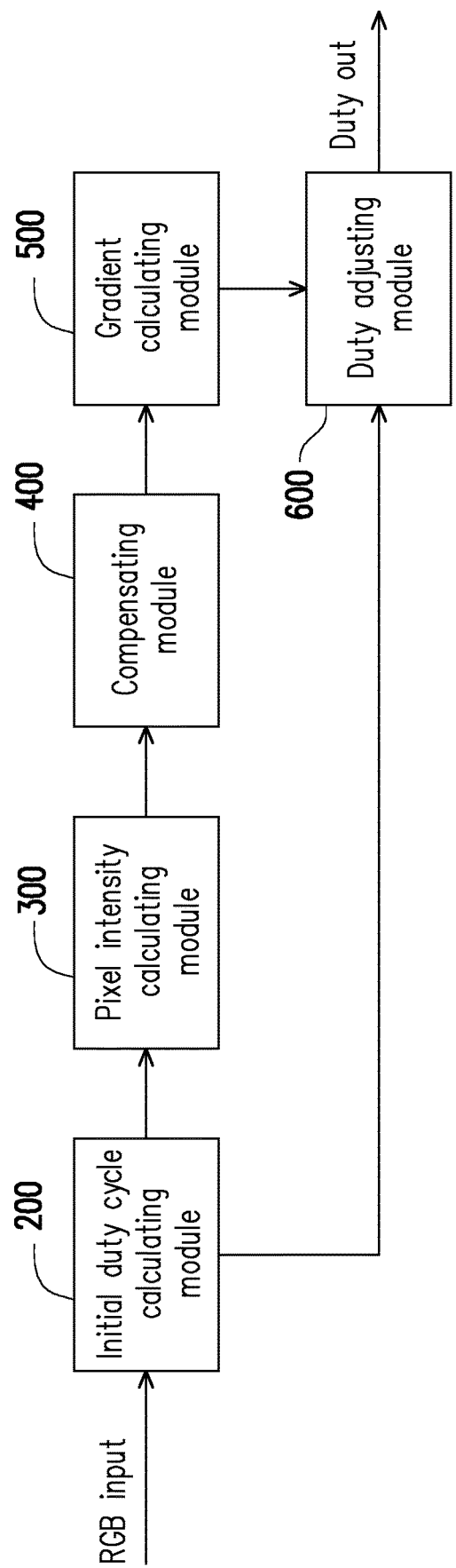
FIG. 6 is a block diagram illustrating local dimming control modules performing steps in FIGS. 3A, 3B, and 3C.

FIG. 5 is a block diagram illustrating a local dimming control device according to an embodiment of the disclosure. FIG. 6 is a block diagram illustrating local dimming control modules performing steps in FIGS. 3A, 3B, and 3C. As shown in FIG. 5, a local dimming control device 130 includes a processor 131 and a memory 132. The memory 132 stores a plurality of program codes. The processor 131 is in communication with the memory 132 and executes the program codes stored in the memory 132. The local dimming control device 130 is used for a backlight module having a plurality of light emitting diodes, each light emitting diode is configured to provide light to one pixel in a display panel, for example, is used for the liquid crystal panel 110 having the pixels $P_{11}$ to $P_{mn}$, the backlight module 120 having the light emitting diodes $LED_{11}$ to $LED_{mn}$, shown in FIGS. 1 and 2.

As shown in FIG. 6, an initial duty cycle calculating module 200, a pixel intensity calculating module 300 (or local luminance calculating module), a compensating module 400, a gradient calculating module 500, and a duty adjusting module 600 are formed by the program codes in the memory 132. That is to say, the pixel intensity calculating module 300, the compensating module 400, the gradient calculating module 500, and the duty adjusting module 600 are executed by the processor 131.

Specifically, the processor 131 executes the pixel intensity calculating module 300 to perform the step S100 to determine an initial duty cycle of a driving signal provided to drive each light emitting diode, and step S100 in FIG. 3A is described in details above. In addition, the processor 131 executes the pixel intensity calculating module 300 to perform the step S200 to calculate brightness of each light emitting diode according to the initial duty cycle of the driving signal and to perform the step S300 to calculate a local luminance of each light emitting diode based on combination of brightness of that light emitting diode and light diffusion of surrounding light emitting diodes. The steps S200 and S300 in FIG. 3A are described in details above.

Further, the processor 131 executes the gradient calculating module 500 to perform the step S400 to calculate a cost function of clipping error and leaking error according to the local luminance of each light emitting diode and an ideal brightness of the corresponding pixel, and to perform the step S500 to calculate a gradient of the cost function of clipping error and leaking error. The steps S400 and S500 in FIG. 3A are described in details above.

Finally, the processor 131 executes the duty adjusting module 600 to perform the step S600 to adjust the initial duty cycle of each light emitting diode according to the gradient, an image characteristic of the pixel corresponding to that light emitting diode, and image characteristics of surrounding pixels to provide an adjusted duty cycle of the driving signal. At this time, the processor 131 executes the duty adjusting module 600 to perform the step S600a to increase the initial duty cycle when the gradient of the cost function of clipping error and leaking error is negative. On the other hand, the processor 131 executes the duty adjusting module 600 to perform the step S600b to decrease the initial duty cycle when the gradient of the cost function of clipping error and leaking error is positive. The step S600 in FIG. 3A, the step S600a in FIG. 3B, and the step S600b in FIG. 3C are described in details above.

Last but not least, the processor 131 may execute the compensating module 400 to compensate the loss of brightness due to dimmed backlights. The red, green, and blue data inputs should be scaled by a gain, and gain is equal to the multiplicative inverse of pixel intensity. However, the compensating module 400 may not be performed.

Summarily, in the local dimming control method and device of the disclosure, the brightness of the surrounding light emitting diodes is also considered in calculating the local luminance of one light emitting diode. In other words, the light diffusion is considered in calculating the local luminance.

In addition, when the gradient of the cost function of clipping error and leaking error is calculated, the direction that the cost function of clipping error and leaking error increases the most rapidly is also defined. Therefore, modifying the duty cycle of the driving signal of the light emitting diode in the opposite direction makes the cost function of clipping error and leaking error decrease the most rapidly, which means the smaller clipping error and leaking error. In addition, the adjusted duty cycle of one light emitting diode is calculated with considering the image characteristic of the pixel corresponding to that light emitting diode and the image characteristics of the surrounding pixels. That is to say, the duty cycle is adjusted quickly (with just one time adjustment) and properly with considering of light diffusion of the surrounding light emitting diodes, thereby enhancing the display quality of the display panel. In comparison with conventional method, iteration in calculating the gradient is not required in the disclosure, and the image characteristics of the surrounding pixels are also considered in the disclosure so the light diffusion is taken into consideration.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A local dimming control method for a backlight module having a plurality of light emitting diodes, each light emitting diode being configured to provide light to one pixel in a display panel, the local dimming control method comprising:

determining an initial duty cycle of a driving signal provided to drive each light emitting diode;
calculating brightness of each light emitting diode according to the initial duty cycle of the driving signal;
calculating a local luminance of each light emitting diode based on combination of brightness of that light emitting diode and light diffusion of surrounding light emitting diodes;
calculating a cost function of clipping error and leaking error according to the local luminance of each light emitting diode and an ideal brightness of the corresponding pixel;
calculating a gradient of the cost function of clipping error and leaking error; and
adjusting the initial duty cycle of each light emitting diode according to the gradient, an image characteristic of the pixel corresponding to that light emitting diode, and image characteristics of surrounding pixels to provide an adjusted duty cycle of the driving signal.

2. The local dimming control method as recited in claim 1, wherein step of adjusting the initial duty cycle according to gradient of the cost function of clipping error and leaking error to provide the adjusted duty cycle of the driving signal comprises:
increasing the initial duty cycle when the gradient of the cost function of clipping error and leaking error is negative.

3. The local dimming control method as recited in claim 1, wherein step of adjusting the initial duty cycle according to gradient of the cost function of clipping error and leaking error to provide the adjusted duty cycle of the driving signal comprises:
decreasing the initial duty cycle when the gradient of the cost function of clipping error and leaking error is positive.

4. The local dimming control method as recited in claim 1, wherein the gradient of the cost function of clipping error and leaking error is a derivative of the cost function of clipping error and leaking error with respect to brightness of the light emitting diodes.

5. The local dimming control method as recited in claim 1, wherein the clipping error is a difference between the brightness of each light emitting diode and the ideal brightness of the corresponding pixel.

6. The local dimming control method as recited in claim 1, wherein the leaking error is calculated based on the brightness of each light emitting diode and the ideal brightness of the corresponding pixel.

7. The local dimming control method as recited in claim 1, wherein the driving signal is a pulse width modulation signal.

8. The local dimming control method as recited in claim 1, wherein the initial duty cycle of the driving signal is determined according to red, green, and blue data input.

9. A local dimming control device for a backlight module having a plurality of light emitting diodes, each light emitting diode being configured to provide light to one pixel in a display panel, the local dimming control device comprising:
a memory, storing a plurality of program; and
a processor in communication with the memory, wherein the processor is configured to determine an initial duty cycle of a driving signal provided to drive each light emitting diode,
to calculate brightness of each light emitting diode according to the initial duty cycle of the driving signal and calculate a local luminance of each light emitting diode based on combination of brightness of that light emitting diode and light diffusion of surrounding light emitting diodes, to calculate a cost function of clipping error and leaking error according to the local luminance of each light emitting diode and an ideal brightness of the corresponding pixel and calculate a gradient of the cost function of clipping error and leaking error, and to adjust the initial duty cycle of each light emitting diode according to the gradient, an image characteristic of the pixel corresponding to that light emitting diode, and image characteristics of surrounding pixels to provide an adjusted duty cycle of the driving signal.

10. The local dimming control device as recited in claim 9, wherein the processor is configured to increase the initial duty cycle when the gradient of the cost function of clipping error and leaking error is negative.

11. The local dimming control device as recited in claim 9, wherein the processor is configured to decrease the initial duty cycle when the gradient of the cost function of clipping error and leaking error is positive.

12. The local dimming control device as recited in claim 9, wherein the gradient of the cost function of clipping error and leaking error is a derivative of the cost function of clipping error and leaking error with respect to brightness of the light emitting diodes.

13. The local dimming control device as recited in claim 9, wherein the clipping error is a difference between the brightness of each light emitting diode and the ideal brightness of the corresponding pixel.

14. The local dimming control device as recited in claim 9, wherein the leaking error is calculated based on the brightness of each light emitting diode and the ideal brightness of the corresponding pixel.

15. The local dimming control device as recited in claim 9, wherein the driving signal is a pulse width modulation signal.

16. The local dimming control device as recited in claim 9, wherein the initial duty cycle of the driving signal is determined according to red, green, and blue data input.

* * * * *